US010889122B2

(12) United States Patent
Ng et al.

(10) Patent No.: US 10,889,122 B2
(45) Date of Patent: Jan. 12, 2021

(54) ACCESSING MEMORY UNITS IN A MEMORY BANK

(71) Applicant: HEWLETT-PACKARD DEVELOPMENT COMPANY, L.P., Spring, TX (US)

(72) Inventors: Boon Bing Ng, Vancouver, WA (US); Noorashekin Binte Jamil, Singapore (SG)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 16/480,178

(22) PCT Filed: Jan. 31, 2017

(86) PCT No.: PCT/US2017/015830
§ 371 (c)(1),
(2) Date: Jul. 23, 2019

(87) PCT Pub. No.: WO2018/143940
PCT Pub. Date: Aug. 9, 2018

(65) Prior Publication Data
US 2019/0366727 A1 Dec. 5, 2019

(51) Int. Cl.
*B41J 2/17* (2006.01)
*B41J 2/175* (2006.01)
*G11C 16/06* (2006.01)

(52) U.S. Cl.
CPC ........... *B41J 2/17546* (2013.01); *G11C 16/06* (2013.01)

(58) Field of Classification Search
None
See application file for complete search history.

(56) References Cited

U.S. PATENT DOCUMENTS

| | | | |
|---|---|---|---|
| 4,506,272 A * | 3/1985 | Arai | B41J 2/345 347/210 |
| 5,261,050 A | 11/1993 | Fox | |
| 5,345,314 A | 9/1994 | Ho-Il | |
| 5,483,265 A | 1/1996 | Kneezel | |
| 5,537,576 A | 7/1996 | Perets et al. | |
| 5,654,925 A * | 8/1997 | Koh | G11C 16/08 365/201 |
| 6,459,647 B1 | 10/2002 | Kengeri | |
| 6,543,883 B1 * | 4/2003 | Dodd | B41J 2/14072 347/58 |
| 6,565,175 B1 * | 5/2003 | Scardovi | B41J 2/04521 347/12 |
| 7,064,986 B2 * | 6/2006 | Lee | G11C 16/0483 365/185.09 |

(Continued)

FOREIGN PATENT DOCUMENTS

| | | |
|---|---|---|
| CN | 1890101 | 1/2007 |
| CN | 101971134 | 2/2011 |

(Continued)

*Primary Examiner* — Tan T. Nguyen
(74) *Attorney, Agent, or Firm* — Fabian Van Cott (57) ABSTRACT

The present subject matter relates to accessing memory units in a memory bank. In an example implementation, a bank select transistor is common to a plurality of memory units in a memory bank. The bank select transistor facilitates accessing a memory unit of the plurality of memory units based on a bank select signal.

20 Claims, 8 Drawing Sheets

(56) References Cited

U.S. PATENT DOCUMENTS

| | | | |
|---|---|---|---|
| 8,074,010 B2 | 12/2011 | Hutson | |
| 8,120,985 B2 | 2/2012 | Kunce et al. | |
| 8,161,356 B2 | 4/2012 | Bains et al. | |
| 8,443,162 B2 | 5/2013 | Speier et al. | |
| 8,616,666 B2* | 12/2013 | Truong | B41M 3/00 |
| | | | 347/9 |
| 2005/0231541 A1* | 10/2005 | Benjamin | B41J 2/04543 |
| | | | 347/12 |
| 2005/0231545 A1* | 10/2005 | Benjamin | B41J 2/04543 |
| | | | 347/19 |
| 2009/0213432 A1 | 8/2009 | Lapstun et al. | |
| 2009/0244132 A1* | 10/2009 | Bruce | B41J 2/04598 |
| | | | 347/10 |
| 2010/0271867 A1 | 10/2010 | Lee | |
| 2010/0328405 A1 | 12/2010 | Ness et al. | |
| 2015/0255161 A1* | 9/2015 | Lee | G11C 16/3445 |
| | | | 365/185.12 |
| 2015/0287460 A1 | 10/2015 | Lee | |

FOREIGN PATENT DOCUMENTS

| | | |
|---|---|---|
| CN | 103827807 | 5/2014 |
| CN | 105940454 | 9/2016 |
| EP | 3100273 | 12/2016 |
| JP | S62006494 | 1/1987 |
| JP | H05501769 | 4/1993 |
| JP | 2003508827 | 3/2003 |
| JP | 2009245527 | 10/2009 |
| WO | WO-1992002893 | 2/1992 |
| WO | WO-0214072 A1 | 2/2002 |
| WO | WO-2015116129 | 8/2015 |
| WO | WO-2016014082 | 1/2016 |

\* cited by examiner

ACCESSING MEMORY UNITS IN A MEMORY BANK

BACKGROUND

Memory units are widely used to store information. For example, in a print head, information relating to attributes of a print cartridge are usually stored in memory units. The information may be stored in the memory units in binary form, i.e., as '0's and '1's. Some example types of memory units are Mask Read Only Memory (MROM), Erasable Programmable Read Only Memory (EPROM), and Electrically Erasable Programmable Read Only Memory (EEPROM) memory units. In some cases, several memory units are arranged together in the form of a single memory bank. A memory bank may include a plurality of memory units in the form of a matrix, i.e., in rows and columns.

BRIEF DESCRIPTION OF DRAWINGS

The following detailed description references the figures, wherein.

DETAILED DESCRIPTION

Memory banks may be used in a fluid ejection die, such as a print head, to store various information related to the fluid ejection die, such as identification information, serial numbers, security information, feature enhancement information, and the like. Since a memory bank includes a plurality of memory units, in order to read or write data to a memory unit in the memory bank, the memory unit is to be selected prior to the reading or writing operation. As the memory units are arranged in rows and columns, a memory unit can be selected by selecting the row and column in which the memory unit indisposed. The row and the column corresponding to the memory unit may be selected by providing a set of select signals, such as a row select signal, which is applied to the row corresponding to the memory unit, and a column select signal, which is applied to the column corresponding to the memory unit.

In cases where a large amount of data is to be stored, several memory banks may be used. In such a case, in order to access a memory unit for reading or writing, in addition to selecting the row and column corresponding to the memory unit, the memory bank corresponding to the memory unit is also to be selected. Accordingly, a bank select signal is also provided to the memory bank corresponding to the memory unit to be selected.

The various select signals may be generated by one or more registers. Thus, the selection of a memory unit may be performed by one or more registers, which generate the row select signal to select a row of a memory unit, the column select signal to select a column of the memory unit, and a bank select signal to select the bank in which the memory unit is present.

The present subject matter relates to aspects of accessing memory units in a memory bank. Implementations of the present subject matter provide an efficient layout that minimizes the amount of space consumed, for example, in a fluid ejection die, for implementing the various select registers.

In accordance with an example, implementation of the present subject a bank select transistor is provided common to a plurality of memory units present in a memory bank. The plurality of memory units in the memory bank are arranged in the form of a matrix having a plurality of rows and columns. The bank select transistor facilitates accessing a memory unit of the plurality of memory units in the memory bank based on a bank select signal, which may be provided by a select register.

In accordance with an example implementation of the present subject matter, a plurality of memory banks is provided in a device, such as a fluid ejection die. Each memory bank is provided with a plurality of memory units and a bank select transistor common to the plurality of memory units. The bank select transistor in a memory bank receives the bank select signal for facilitating access to a memory unit in the memory bank. The bank select transistor may be connected to each memory unit through a row select transistor and a column select transistor connected to the memory unit, and can facilitate access to a memory unit of the plurality of memory units upon receiving the bank select signal.

Since the bank select transistor is common to a plurality of memory units in the memory bank, the access of the plurality of memory units can be controlled using a single bank select signal, which is provided to the bank select transistor. Further, by provisioning a single bank select transistor commonly to a plurality of memory units in the memory bank, instead of provisioning one bank select transistor per memory unit, the present subject matter considerably reduces the number of transistors to be provisioned in a memory bank to facilitate access to the memory units. This reduces the size of the device employing the memory banks. Therefore, the aspects of the present subject matter can be used in space constrained devices, such as print heads, for storing a large amount of data in a limited amount of space. The reduction in the number of transistors provisioned also enables having more memory units and memory banks in the device, thereby increasing the number of functions performed by the device.

The following description refers to the accompanying drawings. Wherever possible, the same reference numbers are used in the drawings and the following description to refer to the same or similar parts. While several examples are described in the description, modifications, adaptations, and other implementations are possible. Accordingly, the following detailed description does not limit the disclosed examples. Instead, the proper scope of the disclosed examples may be defined by the appended claims.

Example implementations of the present subject matter are described with regard to memory banks used in fluid ejection dies, such as print heads. Although not described, it will be understood that the implementations of the present subject matter can be used with other types of fluid ejection dies where a memory unit in one of several memory banks is to be accessed.

Figure 1:
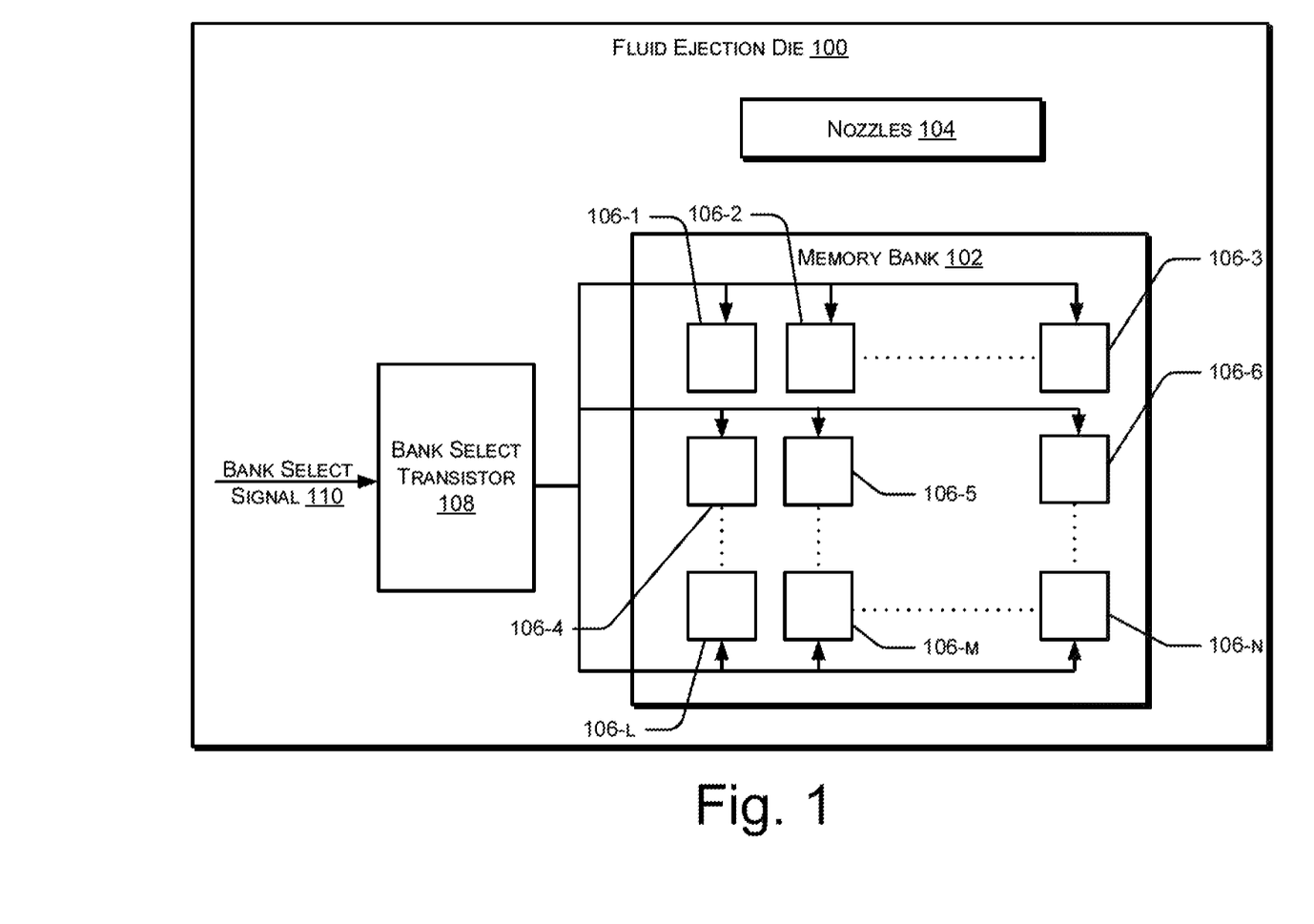
FIG. 1 illustrates a fluid ejection die, according to an example implementation of the present subject matter.

FIG. 1 illustrates a fluid ejection die 100, according to an example implementation of the present subject matter. Example of the fluid ejection die 100 includes, but not limited to, a print head, such as a thermal inkjet (TIJ) print head and a piezoelectric inkjet print head. The fluid ejection die 100 ejects drops of fluid, such as ink and liquid toner, through a plurality of orifices or nozzles 104 toward a print medium (not shown in FIG. 1), so as to print onto the print medium. The print medium can be any type of suitable sheet material, such as paper, card stock, fabric, and the like. Typically, the nozzles 104 are arranged in one or more columns or arrays such that properly sequenced ejection of fluid from the nozzles causes characters, symbols, and/or other graphics or images to be printed upon print medium.

The memory bank 102 also includes a plurality of memory units 106-1, 106-2, . . . , 106-n, collectively referred to as memory units 106. The memory units 106 are arranged in the memory bank 102 in the form of a matrix having a plurality of rows and columns.

Each of the memory units 106 is capable of storing data. The data that can be stored in a memory unit may be, for example, one bit of data, i.e., logic '0' or '1'. Further, the data stored in the memory unit can be retrieved. In other words, each memory unit can be written to or read from. A memory unit can be accessed for writing data or reading data. In order to facilitate accessing a memory unit of the memory units 106, the fluid ejection die 100 includes a bank select transistor 108. Although the bank select transistor 108 is shown to be disposed outside of the memory bank 102, in an implementation, the bank select transistor 108 is disposed within the memory bank 102.

The bank select transistor 108 is common to the memory units 106. The bank select transistor 108 can be made common to the memory units 106 by connecting the bank select transistor 108 with each memory unit of the memory units 106. Here, the bank select transistor 108 is shown connected to the memory units 106 through arrows to indicate that the bank select transistor 108 can be connected to the memory units 106 either directly or indirectly. The connection of the bank select transistor 108 with the memory units 106 is explained with reference to FIG. 3. The bank select transistor 108 receives a bank select signal 110. Based on the bank select signal 110, the bank select transistor 108 facilitates accessing memory units in the memory bank 102.

In an implementation, the memory units 106 are electrically programmable read only memory (EM) memory units. The term "EM memory unit", as used in the present specification, is to be broadly understood as any programmable read-only memory that retains its data when its power supply is switched off. In an example, the EM is an erasable programmable read only memory (EPROM). In another example, the EM is an electrically erasable programmable read only memory (EEPROM).

Although FIG. 1 illustrates a single memory bank 102 in the fluid ejection die 100, the fluid ejection die 100 can include a plurality of memory banks. Accordingly, each memory bank can have a corresponding bank select transistor, which is common to a plurality of memory units in that memory bank.

The bank select transistor 108 receives the bank select signal 110 from a bank select register (not shown in FIG. 1), which generates the bank select signal 110 based on the memory bank from which a memory unit is to be accessed. Each memory unit can also have a row select transistor and a column select transistor (both not shown in FIG. 1) associated with it. A memory unit can be accessed when the row select transistor and the column select transistor connected to it receives a row select signal and a column select signal, respectively, and the bank select transistor 108 receives the bank select signal 110. By providing a common bank select transistor 108 for the plurality of memory units 106, instead of providing a separate bank select transistor corresponding to each memory unit, considerable space saving is achieved in the fluid ejection die 100.

The above described implementations will be explained in greater detail with reference to the subsequent paragraphs.

Figure 2A:
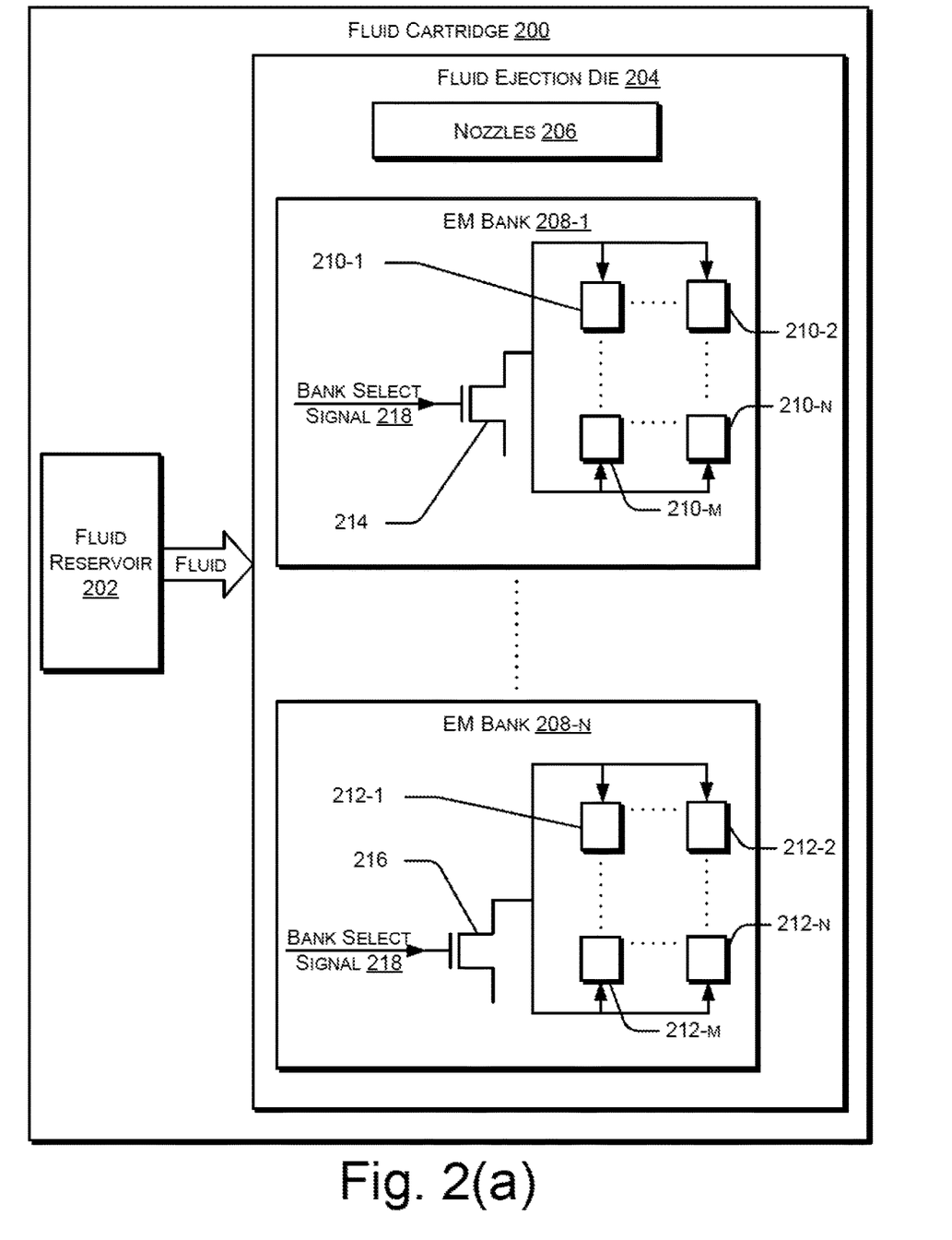
FIG. 2(a) illustrates a fluid cartridge including a fluid ejection die, according to an example implementation of the present subject matter.

FIG. 2(a) illustrates a fluid cartridge 200, according to an example implementation of the present subject matter. The fluid cartridge 200 is more generally a fluid-jet precision-dispensing device or fluid ejector structure that precisely dispenses fluid, such as ink and liquid toner. In an example, the fluid cartridge 200 may be a print cartridge, such as a single color ink cartridge for a fluid-jet printer.

While the present description describes generally an inkjet-printing cartridge that ejects ink onto media, examples of the present specification may not be limited to inkjet printing cartridges alone. In general, examples of the present specification pertain to any type of fluid-jet precision-dispensing or ejection devices that dispense a fluid. The term fluid is meant to be broadly interpreted as any substance that deforms under an applied force. Examples of fluids, therefore, include liquids and gases. A fluid-jet precision-dispensing device is a device in which printing, or dispensing, of the fluid in question is achieved by precisely printing or dispensing in accurately specified locations, with or without making a particular image on that which is being printed or dispensed on. Thus, for purposes of explanation, a print cartridge or ink cartridge will be described. However, it will be understood that any type of fluid cartridge may be used with the principles described herein.

In an implementation, the fluid cartridge 200 includes a fluid reservoir 202 to store a fluid, such as ink and liquid toner, and a fluid ejection die 204, such as the fluid ejection die 100, that is coupled to the fluid reservoir 202. When the fluid cartridge 200 is a print cartridge, the fluid stored in the fluid reservoir 202 may be referred to as a print material, and the fluid reservoir 202 may be referred to as a print material reservoir. The fluid stored in the fluid reservoir 202 can flow to the fluid ejection die 204, which ejects drops of the fluid through a plurality of nozzles 206 toward a print medium.

In an example, the fluid ejection die 204 includes a plurality of EM banks 208-1, . . . , 208-n, collectively referred to as EM banks 208. An EM bank refers to any combination of any number of matrices of EM memory units. The EM banks 208 can be used to store various information about a device on which they are used. For example, if the fluid ejection die 204 is a print head, the information stored, may be, identification information, such as identification of the print head, type of ink cartridge, and kind of ink contained in the ink cartridge, serial numbers, security information, feature enhancement information, and the like. Based on the information stored in the EM banks 208, a printer controller (not shown in FIG. 2(a)) in the printer (not shown in FIG. 2(a)) that includes the fluid ejection die 204 may take one or more actions, such as altering printing routines to maintain image quality.

Each EM bank includes a matrix of plurality of EM memory units. A matrix of memory units refers to an arrangement of memory units in a plurality of rows and columns. For instance, the EM bank 208-1 includes EM memory units 210-1, 210-2, . . . , 210-n in the form of a matrix. Similarly, the EM bank 208-n includes EM memory units 212-1, 212-2, . . . , 212-n in the form of a matrix.

In an example, an EM bank includes 64 memory units. In an example, a matrix of memory units includes memory units arranged in eight rows and eight columns, i.e., the matrix of memory units is an 8×8 arrangement of memory units. In another example, the matrix of memory units is an 8×4 arrangement of memory units, i.e., having memory units arranged in eight rows and four columns. In yet other examples, other arrangements, such as 4×8, 2×16, and the like may be used.

In addition to the matrix of plurality of EM memory units, each EM bank also includes a bank select transistor. For instance, the EM bank 208-1 includes a bank select transistor 214 and the EM bank 208-n includes a bank select transistor 216. The bank select transistor in an EM bank is common to the plurality of EM memory units. In order to make the bank select transistor common to the plurality of EM memory units, the bank select transistor may be connected to each memory unit of the plurality of EM memory units. For instance, referring to FIG. 2(a), the bank select transistor 214 can be connected to each EM memory unit, i.e., to EM memory unit 210-1, EM memory unit 210-2, . . . , EM memory unit 210-n, of the EM memory units 210. The connection of the bank select transistor with the plurality of EM memory units is explained with reference to FIG. 3.

Each bank select transistor includes a gate terminal. The gate terminal can be used to receive a bank select signal, which is a signal used to select a particular EM bank. When the bank select transistor receives the bank select signal at its gate terminal, the bank select transistor turns on. Since the bank select transistor is common to the matrix of plurality of EM memory units, the turning on of the bank select transistor facilitates accessing an EM memory unit in the matrix for reading or writing.

Therefore, referring back to FIG. 2(a), when the bank select transistor 214 receives a bank select signal 218 at its gate terminal, accessing the EM memory units 210-1, 210-2, . . . , 210-n is facilitated. Similarly, when the bank select transistor 216 receives the bank select signal 218 at its gate terminal, accessing the EM memory units 212-1, 212-2, . . . , 212-n is facilitated. The bank select transistors in the different EM banks may receive the bank select signal 218 at different points of time, so that, at any point of time, access to the EM memory units in a single EM bank alone is facilitated. The generation of the bank select signal is explained with reference to FIG. 5. In an implementation, the bank select transistor 214 is connected to each EM memory unit through a row select transistor and a column select transistor connected to the EM memory unit.

Figure 2B:
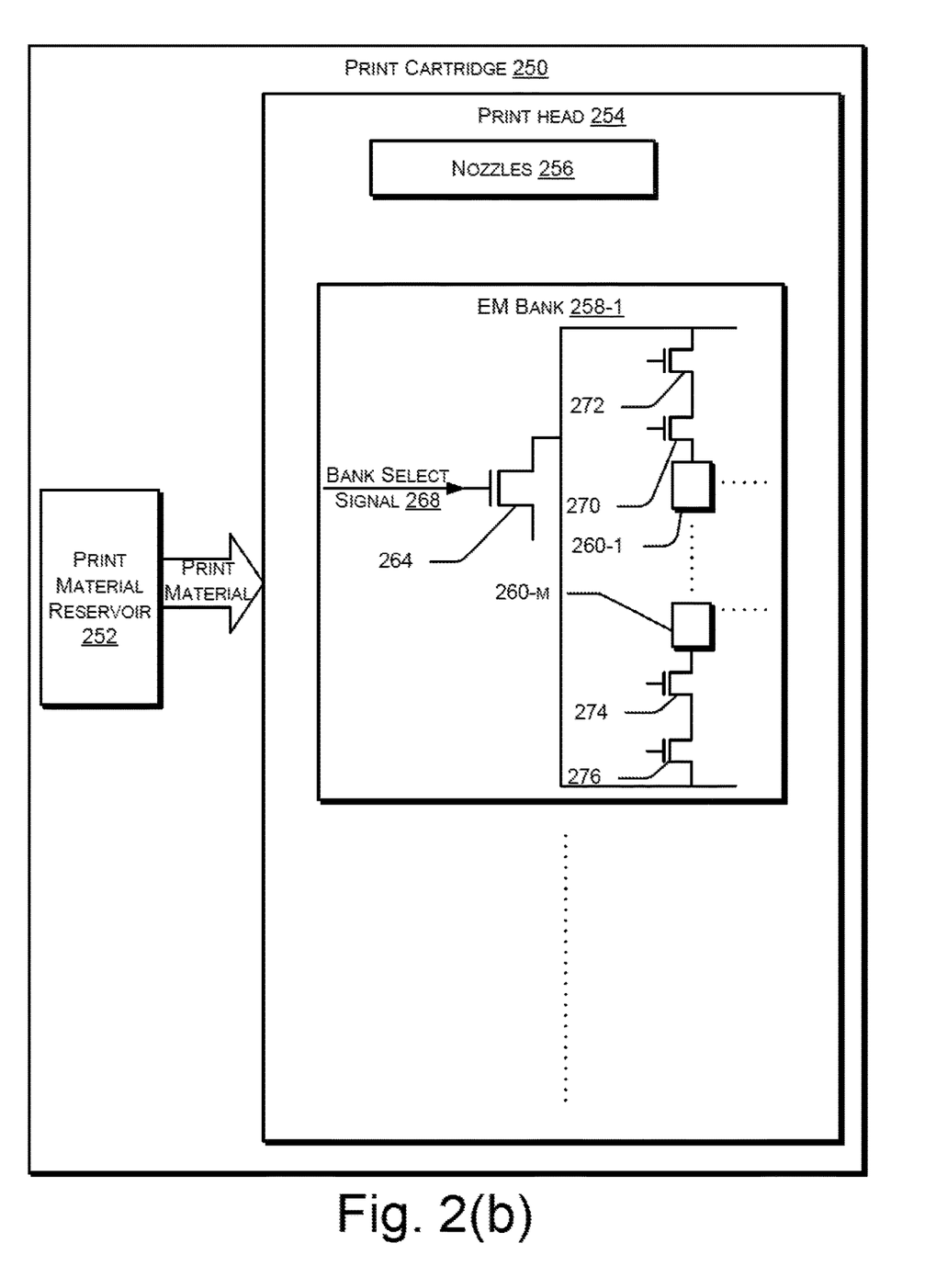
FIG. 2(b) illustrates a print cartridge including a print head, according to an example implementation of the present subject matter.

FIG. 2(b) illustrates a print cartridge 250, according to an example implementation of the present subject matter. The print cartridge 250 may be similar to the fluid cartridge 200. A component of the print cartridge 250 that corresponds to a component of the fluid cartridge 200 is denoted by a reference numeral that is 50 greater than the corresponding component of the fluid cartridge 200. For example, the nozzles 256 in the print cartridge 250 correspond to nozzles 206 in the fluid cartridge 200. Similar to the fluid cartridge 200, the print cartridge 250 also may include n EM banks. However, a single EM bank 258-1 is shown for clarity. Similarly, the EM bank 258-1 includes EM memory units in a plurality of rows and columns, although a single column of EM memory units is shown.

The EM unit 260-1 is connected to the bank select transistor 264 through a column select transistor 270 and a row select transistor 272. Similarly, the EM unit 260-m is connected to the bank select transistor 264 through a column select transistor 274 and a row select transistor 276. The connection of the bank select transistor to a matrix of a plurality of EM memory units in a memory bank, through row select and column select transistors, is explained with reference to FIG. 3. A matrix of a plurality of EM memory units may be interchangeably referred to as a matrix of EM memory units.

Figure 3:
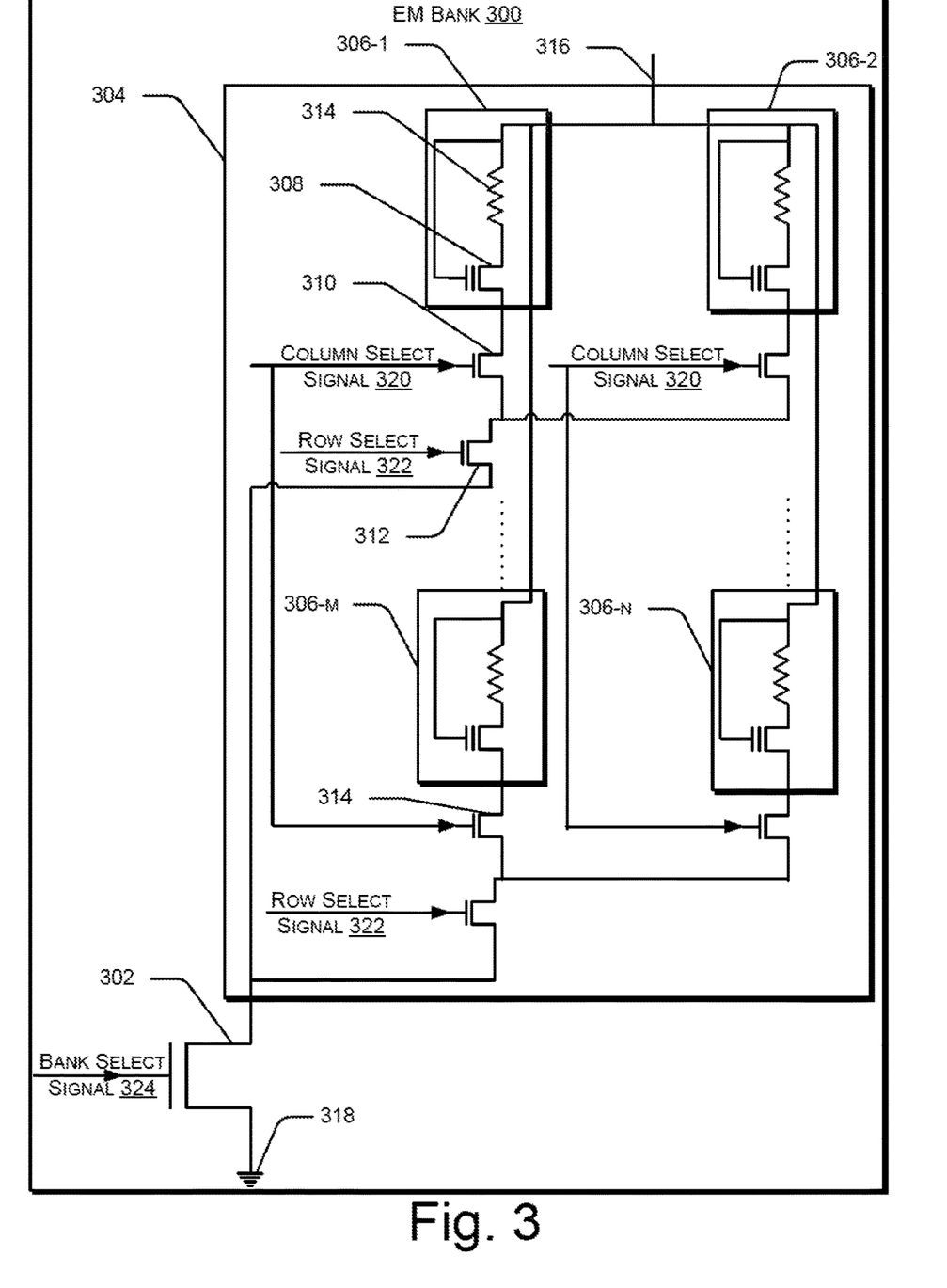
FIG. 3 illustrates connection of a bank select transistor to a matrix of electrically programmable read only memory (EM) memory units in a memory bank, according to an example implementation of the present subject matter.

FIG. 3 illustrates connection of a bank select transistor 302 to a matrix 304 of EM memory units in a memory bank 300, according to an example implementation of the present subject matter. The matrix 304 of EM memory units includes a plurality of EM memory units 306-1, 306-2, . . . , 306-m, 306-n, collectively referred to as EM memory units 306. Although the matrix 304 of EM memory units is shown to include EM memory units in 2 rows and 2 columns, it is to be understood that a matrix may include any number of rows and columns of EM memory units. In an example, the matrix 304 is an 8×8 matrix of EM memory units.

The EM memory unit 306-1 includes a floating gate transistor 308. A drain terminal of the floating gate transistor 308 is connected to one terminal of a resistor 314. The other terminal of the resistor 314 is connected to an identification (ID) line 316, through which the floating gate transistor 308 can be accessed for reading or writing. A source terminal of the floating gate transistor 308 is connected to a drain terminal of a column select transistor 310. A source terminal of the column select transistor 310 is connected to a drain terminal of a row select transistor 312. In this manner, the floating gate transistor 308, the column select transistor 310, and the row select transistor 312 are connected together. Such a connection of the floating gate transistor 308, the column select transistor 310, and the row select transistor 312 may be referred to as a series connection. Further, a source terminal of the row select transistor 312 is connected to a drain terminal of the bank select transistor 302. This way, the bank select transistor 302 is connected to the EM memory unit 306-1. Such a connection of the bank select transistor 302 with the EM memory unit 306-1 (through the column select transistor 310 and the row select transistor 312) may be referred to as a series connection. A source terminal of the bank select transistor 302 may be connected to a reference voltage, for example, ground 318.

The floating gate transistor 308, the column select transistor 310, and the row select transistor 312 can be, for example, metal-oxide-semiconductor field-effect transistors (MOSFETs). In an example, the floating gate transistor 308, the column select transistor 310, and the row select transistor 312 are N-type (NMOS) devices. In other examples, the floating gate transistor 308, the column select transistor 310, and the row select transistor 312 are PMOS devices or CMOS devices. In an implementation, the bank select transistor 302 is a MOSFET, and may be an NMOS device.

In an implementation, each EM memory unit includes a corresponding column select transistor. In other words, a floating gate transistor in an EM memory unit is connected to a column select transistor dedicated to the EM memory unit. For instance, the column select transistor 310 is dedicated to the EM memory unit 306-1, and is not connected to any floating gate transistor other than the floating gate transistor 308. However, a row select transistor is common to all EM memory units in a particular row of the matrix of EM memory units. In other words, a row select transistor corresponds to a row of a matrix of EM memory units. Referring to FIG. 3, the row select transistor 312 corresponds to the first row of EM memory units in the matrix 304. Therefore, the row select transistor 312 is connected to each column select transistor in the first row of the matrix 304. Although, the row select transistor is shown to correspond to an entire row of EM memory units, while the column select transistor corresponds to one EM memory unit, in an implementation, the column select transistor can correspond to an entire column of EM memory units, while the row select transistor corresponds to one EM memory unit. In another implementation, each EM memory unit may have a row select transistor and column select transistor corresponding to it.

The other EM memory units 306-2, . . . , 306-m, 306-n may be identical to the EM memory unit 306-1, and include similar components and connections as the EM memory unit 306-1. Therefore, the source terminal of the floating gate transistor of each EM memory unit is connected to the drain terminal of the column select transistor corresponding to that EM memory unit, and the source terminal of the column select transistor is connected to the drain terminal of the row select transistor corresponding to the row having that EM memory unit. Further, the source terminal of the row select transistor corresponding to each row in the matrix 304 is connected to the drain terminal of the bank select transistor 302. This way, the bank select transistor 302 is connected with each EM memory unit in the matrix 304 of EM memory units. In other words, such a connection enables making the bank select transistor 302 common to the plurality of EM memory units 306-1, 306-2, . . . , 306-n in the matrix 304.

Although providing a common bank select transistor to a matrix of EM memory units is illustrated with the help of a series connection of the bank select transistor with the other transistors in the matrix, it will be understood that any other method of making the bank select transistor a common one to the matrix may be used.

The floating gate transistor 308 includes two gate terminals that are separated from one another by an oxide layer, which acts as a dielectric. One of the gates is called a floating gate and the other is called a control gate. The floating gate's link to the ID line 316 is through the control gate. When the gate terminals, of all of the floating gate transistor 308, the column select transistor 310, and the row select transistor 312 are open, i.e., not supplied with a voltage signal, the EM memory unit 306-1 stores no data, giving it a value of logic '0' (low resistance state). In such a case, the floating gate has no charge, which causes the threshold voltage of the EM memory unit 306-1 to be low. In other words, in this case, the EM memory unit 306-1 stores a value of logic '0'.

To change the value stored in the EM memory unit 306-1 to logic '1' (high resistance state), the column select transistor 310 and the row select transistor 312 are to be turned on by applying a voltage signal at their respective gate terminals. Thereafter, a programming voltage is to be applied to the control gate and drain terminal of the floating gate transistor 308. The programming voltage may be applied through the ID line 316. The programming voltage draws excited electrons to the floating gate, thereby increasing the threshold voltage. The excited electrons are pushed through and trapped on the other side of the thin oxide layer, giving it a negative charge. These negatively charged electrons act as a barrier between the control gate and the floating gate, thereby changing the value stored to the high resistance state, i.e., logic '1'. The application of the programming voltage to change the value stored is referred to as writing data.

In order to read the value stored in the EM memory unit 306-1, first, the column select transistor 310 and the row select transistor 312 are to be turned on. Thereafter, the threshold voltage of the EM memory unit 306-1 can be sensed. If the threshold voltage is low, for example, below a threshold level, the EM memory unit 306-1 is said to have a value of logic '0'. If the threshold voltage is high (i.e., above the threshold level), the EM memory unit 306-1 is said to have a value of logic '1'. The threshold voltage may be sensed using the ID line 316. Since the ID line 316 is connected to all the EM memory units in the matrix 304, all the EM memory units can be written to and read from through the ID line 316.

As mentioned earlier, the turning on of the column select transistor 310 and the row select transistor 312 can be achieved by supplying voltage signals at their respective gate terminals. The voltage signal applied at the gate terminal of the column select transistor 310 is referred to as a column select signal 320 and the voltage signal applied at the gate terminal of the row select transistor 312 is referred to as a row select signal 322. In an implementation, the gate terminals of all column select transistors in a single column of the matrix 304 are connected together, so that the column select signal 320 for that column can turn on all column select transistors in that column. For example, the gate terminal of the column select transistor 310 and the gate terminal of the column select transistor 314, corresponding to the EM memory unit 306-m, is connected together, as both EM memory units 306-1 and 306-m are on the first column of the matrix 304.

As explained earlier, the bank select transistor 302 is connected to all the row select transistors in the matrix 304. Therefore, in order to write data to or read data from an EM memory unit in the matrix 304, the bank select transistor 302 is to be turned on by providing the bank select signal 324 to the bank select transistor 302. Further, in order to prevent data being written to or read from any EM memory unit in the matrix 304, the bank select signal 324 may not be provided to the bank select transistor 302. In short, the accessing of an EM memory unit in the matrix 304 can be controlled by providing and not providing the bank select signal 324 to the bank select transistor 302.

The provision of bank select transistor 302 as a common one to all the EM memory units in the matrix 304, instead of connection of an individual bank select transistor in each EM memory unit, enables reducing the size of the matrix 304, and consequently, the EM bank 300. In an example, provisioning a common bank select transistor for a plurality of EM memory units enables disposing 320 EM memory units in a space that could have accommodated 256 EM memory units if each EM memory unit had a dedicated bank select transistor. Thus, the present subject matter enables accommodating more number of EM memory units in a limited space. Therefore, the print head utilizing the techniques of the present subject matter can accommodate a large number of EM memory units, even if it has limited space availability.

Figure 4:
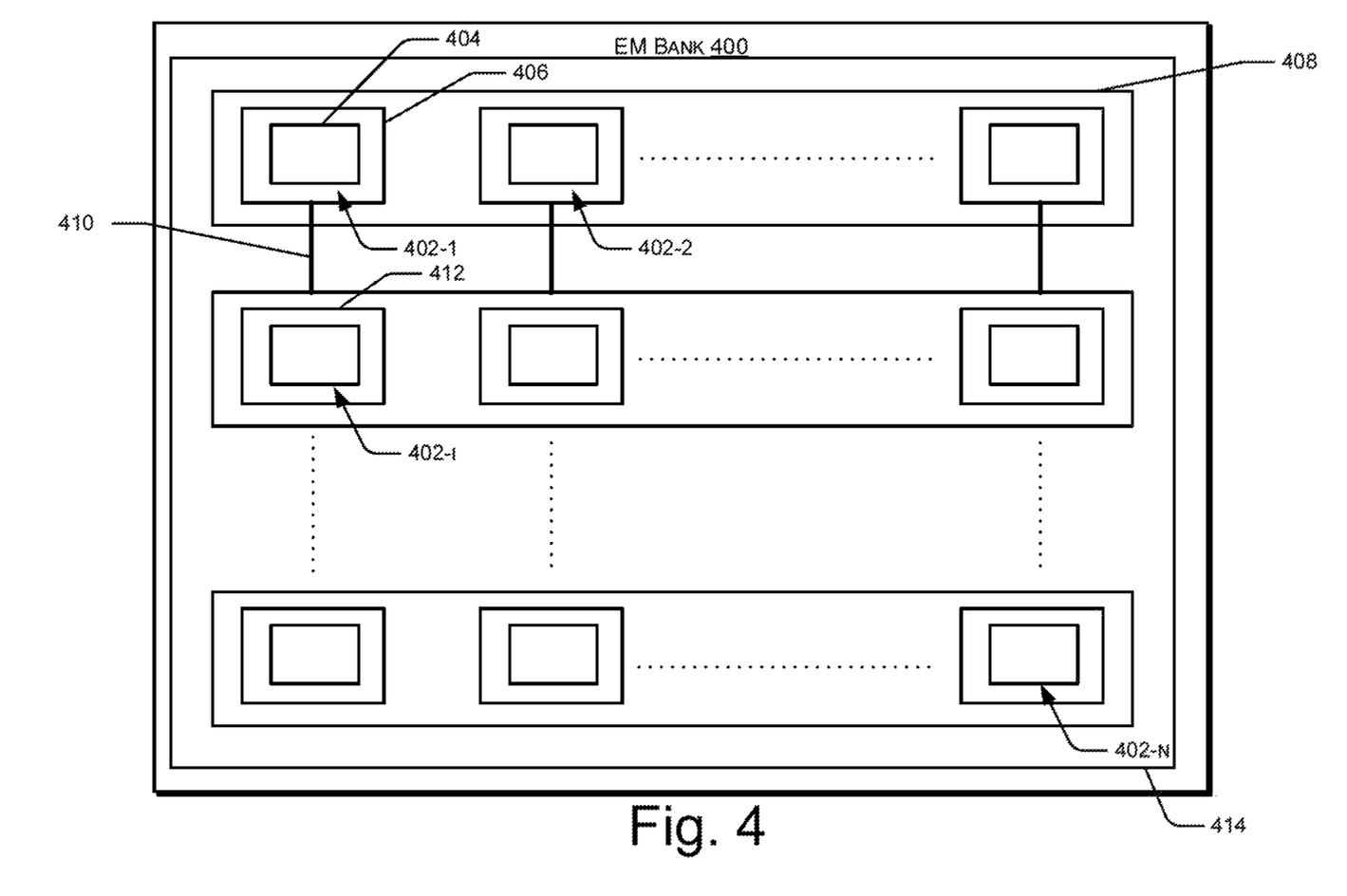
FIG. 4 illustrates the layout of an EM bank, according to an example implementation of the present subject matter.

FIG. 4 illustrates the layout of an EM bank 400, according to an example implementation of the present subject matter. As explained earlier, the EM bank 400 can include a matrix of EM memory units 402-1, 402-2, . . . , 402-n.

The EM memory unit 402-1 includes a floating gate transistor 404 to store a bit of data. The floating gate transistor 404 is surrounded by a column select transistor 406. Further, a row select transistor 408 is disposed around the column select transistor 406. As explained earlier, in this implementation, since the row select transistor 408 corresponds to the entire row having the EM memory unit 402-1, the row select transistor 408 surrounds all the column select transistors in the row having the EM memory unit 402-1. Further, as explained earlier, the gate terminals of all column select transistors in one column of matrix of EM memory units are connected together. Such a connection is illustrated by a jumper 410, which connects the gate terminal of the column select transistor 406 with a column select transistor 412 in the same column and next row.

A bank select transistor 414 is disposed around the matrix of the EM memory units 402-1, 402-2, . . . , 402-n. Such a placement of the bank select transistor 412 facilitates connecting it commonly to all the row select transistors in the matrix. Further, such a placement enables provisioning a large-sized transistor as the bank select transistor 412. The large size of the bank select transistor 412 ensures that it has a small resistance. Further, the large size also enables the bank select transistor 412 to have a high fringe capacitance. The high fringe capacitance improves the charging efficiency of the bank select transistor 412, which, in turn, increases voltage at the gate terminal (Vg) of the bank select transistor 412. A higher Vg reduces the resistance of the bank select transistor 412. Therefore, the additional resistance introduced in each EM memory unit due to the connection of the bank select transistor 412 is minimal. In other words, the overall series turn-on resistance ($R_{on}$) of an EM memory unit is small. The small value of $R_{on}$ increases the programming efficiency of the EM memory unit. In other words, since $R_{on}$ is small, a significant portion of the programming voltage applied to the EM memory unit is used to program the floating gate transistor in the EM memory unit.

In an implementation, the EM memory units at a same height and separated widthwise (for example, 402-1 and 402-2) form a row of EM memory units and the EM memory units that are vertically dispersed, i.e., one below another (for example, 402-1 and 402-i) form a column of EM memory units. Such an arrangement of the EM memory units may be referred to as a vertical column orientation, as the columns are vertical in orientation. However, in another implementation, the EM memory units at the same height form a column of the matrix and the EM memory units one below another form a row of the matrix. In other words, a row select transistor corresponding to a row can be disposed around all the EM memory units one below another, and the gate terminals of all the column select transistors at the same height can be connected together. Such an arrangement of the EM memory units may be referred to as a horizontal column orientation.

Although FIG. 4 illustrates a single matrix of EM memory units in the memory bank 400, however, a memory bank may include a plurality of matrices of EM memory units. A memory bank may include a plurality of matrices of EM memory units if a die, for example, a print head die, on which the memory bank is to be accommodated does not have sufficient dimensions to accommodate all EM memory units of the memory bank as a single matrix. For instance, if the EM bank 400, which has EM memory units in the vertical column orientation, is to include 64 EM memory units, they can be arranged as a single 8×8 matrix of EM memory units if the print head die has sufficient length to accommodate eight rows of EM memory units and sufficient width to accommodate eight columns of EM memory units. However, if the print head die does not have sufficient width to accommodate eight columns of EM memory units, but has sufficient length to include sixteen rows of EM memory units, the 64 EM memory units in the memory bank may be arranged as two 8×4 matrices of EM memory units one below another. Similarly, if an EM bank has a horizontal column orientation and is to include 64 EM memory units, and if the print head die does not have sufficient width to accommodate eight rows of EM memory units, but has sufficient length to include sixteen columns of EM memory units, the 64 EM memory units, in the memory bank may be, arranged as two 4×8 matrices of EM memory units one below another. Such arrangements of the EM banks having a plurality of matrices with different number of rows and columns to account for a limited width of the die is known as a slim EM layout, as these arrangements enable provisioning a 'slimmer' EM bank. On the other hand, the arrangement of the EM banks having a single matrix having the same number of rows and columns, such as an 8×8 matrix, may be referred to as a wide EM layout. The available length and width on the fluid ejection die to accommodate EM memory units is known as available silicon (Si) real estate of a device. In an example, an EM bank having horizontally oriented EM memory units arranged as two 8×4 matrices one below another has a length of 1023 μm and a width of 225 μm. In another example, an EM bank of the wide EM layout having one 8×8 matrix arranged has a length of 486 μm and a width of 425 μm. The arrangement of a plurality of matrices of EM memory units in an EM bank is explained with reference to FIG. 5.

Figure 5:
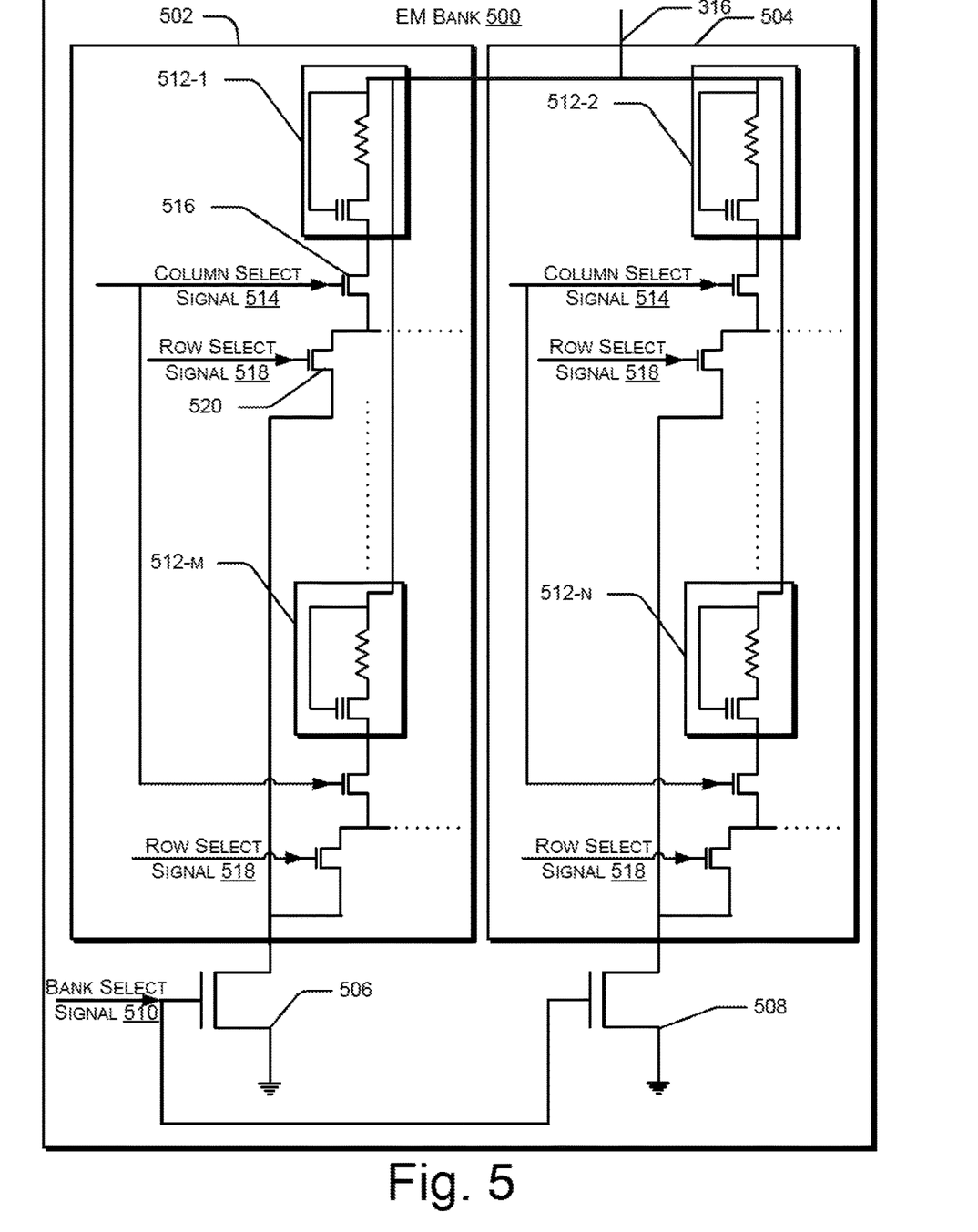
FIG. 5 illustrates an EM bank having a plurality of matrices of EM memory units, according to an example implementation of the present subject matter.

FIG. 5 illustrates an EM bank 500 having a plurality of matrices 502, 504 of EM memory units, according to an example implementation of the present subject matter. The matrix 502 of EM memory units and the matrix 504 of EM memory units may be referred to as a first matrix of EM memory units and second matrix of EM memory units, respectively. The EM memory units in the first matrix 502 of EM memory units may be referred to as a first plurality of EM memory units. Similarly, the EM memory units in the second matrix 504 of EM memory units may be referred to as a second plurality of EM memory units. Although the first matrix 502 and the second matrix 504 are shown to include EM memory units in two rows and one column, however, the matrix 502 and the second matrix 504 may include any number of rows and columns of EM memory units. For example, the first matrix 502 and the second matrix 504 may each include eight rows and four columns (8×4) of EM memory units in vertical column orientation. In another example, the first matrix 502 and the second matrix 504 may each include four rows and eight columns (4×8) of EM memory units in horizontal column orientation. In an implementation, the first matrix 502 and the second matrix 504 include the same number of rows of EM memory units and also the same number of columns of EM memory units.

Although the first matrix 502 and the second matrix 504 of EM memory units are shown to be arranged side-by-side in the memory bank 500, however, in an implementation, the second matrix 504 may be arranged below the first matrix 502. For example, the first matrix 502 and the second matrix 504 may be 8×4 matrices of vertical column orientation or 4×8 matrices of horizontal column orientation arranged one below another. As mentioned earlier, such an arrangement of the first matrix 502 and the second matrix 504 of the EM memory units enables accommodating the memory bank 500 on a fluid ejection die, such as a print head, having lesser width.

In an implementation, each matrix in the EM bank 500 includes a dedicated bank select transistor. In other words, a separate bank select transistor is connected to the plurality of row select transistors present in a single matrix alone. Referring back to FIG. 5, a bank select transistor 506, also referred to as a first bank select transistor, is connected commonly to the row select transistors in the first matrix 504 alone, while a second bank select transistor 508 is connected to the row select transistors in the second matrix 504 alone. It will be understood that, if the EM bank 500 includes additional matrices of EM memory units, the memory bank 500 can include a separate bank select transistor for each additional matrix of EM memory units. For example, if the EM bank 500 includes four 8×2 matrices of EM memory units, the EM bank 500 can include four bank select transistors, each connected to the row select transistors in one matrix.

As illustrated in FIG. 5, the gate terminals of the first bank select transistor 506 and the second bank select transistor 508 are connected together, so that they can receive the bank select signal 510 simultaneously. Therefore, the turn-on of both the first bank select transistor 506 and the second bank select transistor 508 are controlled together based on the bank select signal 510. The provisioning of a separate bank select transistor for each matrix of EM memory units and their connecting their gate terminals together enables utilizing the techniques of the present subject, matter in slim EM layout as well. Therefore, the techniques of the present subject matter can be utilized in print heads having fluid ejection dies of lesser width. Further, since the bank select transistors of the plurality of matrices are connected together, the effective size of the bank select transistor increases. This further increases the fringe capacitance, thereby increasing Vg and reducing resistance. In an example, when the matrix of EM memory units is an 8×8 matrix, the bank select transistor 410 has a width-to-length (W/L) ratio of 1446 µm/4 µm. In an example, when the matrix of EM memory units is an 8×4 matrix, the bank select transistor 410 has a width-to-length (W/L) ratio of 1338 µm/4 µm.

When the first bank select transistor 506 and the second bank select transistor 508 are supplied with the bank select signal 510, data can be read from or written to an EM memory unit in the first matrix 502 or the second matrix 504, provided the row select transistor corresponding to the row of that EM memory unit and the column select transistor corresponding to that EM memory unit are turned on by providing row select signal and column select signal to their respective gate terminals. For example, in order to write data to the EM memory unit 512-1 or to read data from it, column select signal 514 is to be applied to the gate terminal of the column select transistor 516 and the row select signal 518 is to be applied to the gate terminal of the row select transistor 520. The column select signal 514, the row select signal 518, and the bank select signal 510 may be generated by registers. In an implementation, the column select signal 514 is generated by a column select register, the row select signal 518 is generated by a row select register, and the bank select signal 510 is generated by a bank select register.

Figure 6:
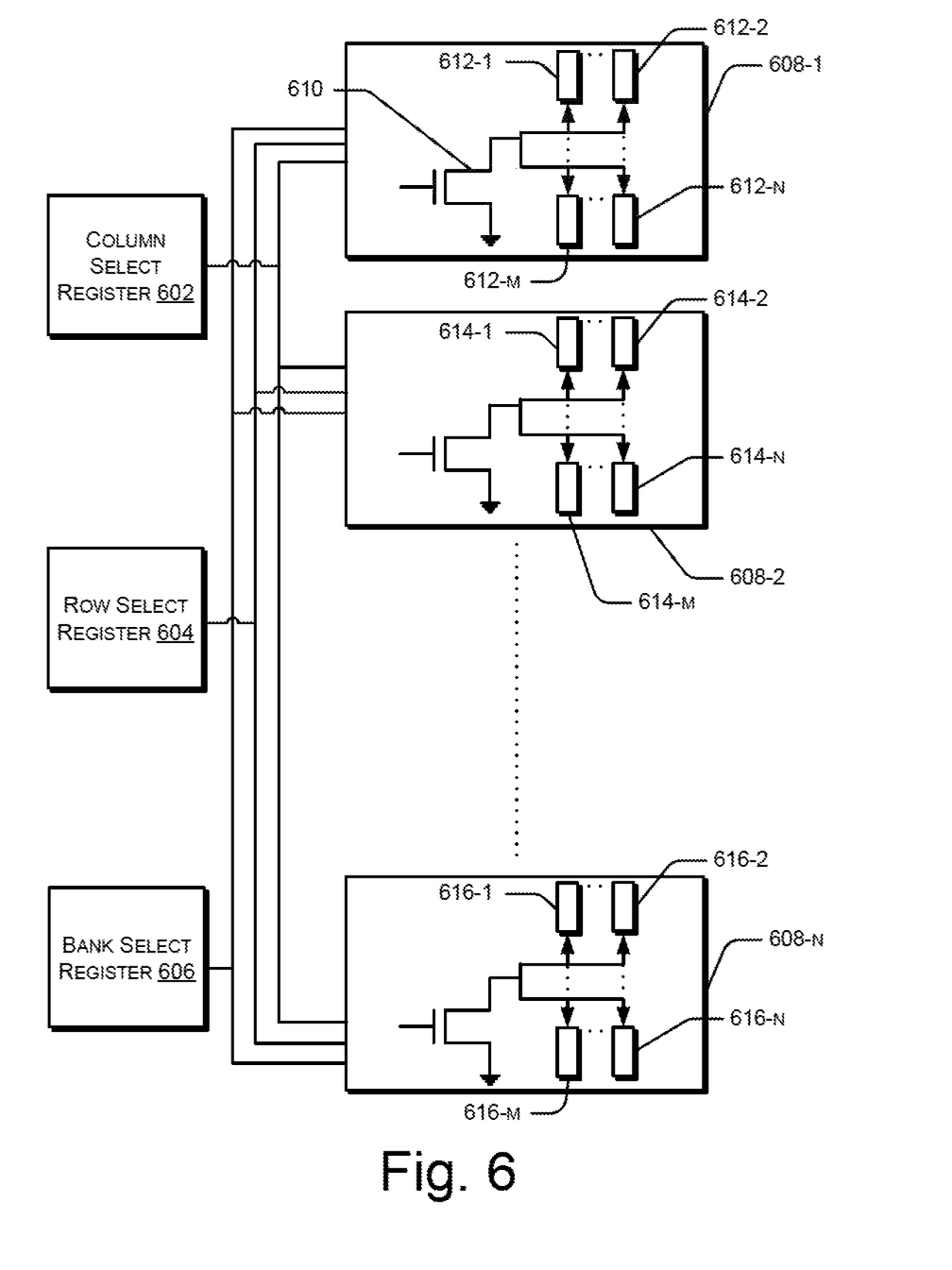
FIG. 6 illustrates a column select register, a row select register, and a bank select register for generation of column select signal, row select signal, and bank select signal respectively, according to an example implementation of the present subject matter.

FIG. 6 illustrates a column select register 602, a row select register 604, and a bank select register 606 for generation of column select signal, row select signal, and bank select signal respectively, according to an example implementation of the present subject matter. Each of the column select register 602, the row select register 604, and the bank select register 606 may be a shift register, for example, a serial-in parallel-out shift register. If the column select register 602, the row select register 604, and the bank select register 606 are shift registers, they may be interchangeably referred to as the column select shift register 602, the row select shift register 604, and the bank select shift register 606 respectively. Further, the column select shift register 602, the row select shift register 604, and the bank select shift register 606 may be collectively referred to as select shift registers. The select shift registers are connected to several memory banks in the device, for example print head memory device, that accommodates the memory banks. For example, the select shift registers are connected to memory banks 608-1, 608-2, . . . , 608-*n*.

In an implementation, each of the select shift registers includes a cascade of flip-flop circuits with two stable states sharing a common time clock. Each flip-flop circuit can be connected to the data input of the next flip-flop in the cascade, resulting in a circuit that shifts a stored bit array by shifting in the data received at its input and shifting out the last bit in the array at each transition of a clock input. Each flip-flop circuit of a select shift register may be referred to as a stage. The select shift registers can include any number of stages. In an example, each of the select shift registers includes eight stages.

As mentioned earlier, the column select shift register 602 generates a column select signal, which can be used to select all EM memory units in a single column of a matrix of EM memory units. For this, as explained earlier, the gate terminals of column select transistors of all EM memory units in a single column are connected together. Therefore, when the column select signal is provided to a given column of a matrix of EM memory units, the column select transistors in all EM memory units in the column are turned on.

The column select shift register 602 can provide column select signals to different columns of EM memory units at different points of time, so that at any point a single column of EM memory units is selected. Since the column select shift register 602 is connected to several EM banks 608-1, 608-2, . . . , 608-*n* (collectively referred to as EM banks 608), the column select signal for a given column is provided to the corresponding column in all the EM banks 608. For instance, a column select signal to select EM memory units in the first column of matrix of EM memory units is provided to the first column of each of the several EM banks 608.

In an implementation, the column select signal for each column of a matrix of EM memory units is generated by a different stage of the column select shift register 602. Therefore, the number of stages in the column select shift register 602 may be same as the number of columns in the matrices of EM memory units. Further, if each EM bank has more than one matrix of EM memory units having more columns than rows, for example, two 4×8 matrices of EM memory units, the column select signal for a given column is provided to the corresponding column in all the matrices. Similarly, if each EM bank has more than one matrix having more rows than columns, the number of stages in the column select shift register 602 may be a sum of the number of columns in each of the matrix. For example, if the EM bank has two 8×4 matrices of EM memory units, the column select shift register 602 includes eight (4+4) stages, so that all eight columns can be provided with different column select signals.

The row select shift register 604 generates a row select signal, which can be used to select all EM memory units in a single row of a matrix of EM memory units. For this, the row select signal can be provided at the gate terminal of the row select transistor corresponding to a row of EM memory units. The row select shift register 604 can provide row select signal to different rows of EM memory units at different points of time, so that at any point of time, a single row of EM memory units is selected. Since the row select shift register 604 is connected to several EM banks 608, the row select signal for a given row is provided to the corresponding row in all the EM banks 608. For instance, a row select signal to select EM memory units in the second row of matrix of EM memory units is provided to the second row of each of the several EM banks 608.

In an implementation, the row select signal for each row of a matrix of EM memory units is generated by a different stage of the row select shift register 604. Therefore, the number of stages in the row select shift register 604 may be same as the number of rows in the matrices of EM memory units. Further, if each EM bank has more than one matrix of EM memory units having, more rows than columns, for example, two 8×4 matrices of EM memory units, the row select signal for a given row can be provided to the corresponding row in all the matrices. Similarly, if each EM bank has more than one matrix of EM memory units having more columns than rows, the number of stages in the row select shift register 604 may be a sum of the number of rows in each of the matrix. For example, if the EM bank has two 4×8 matrices of EM memory units, the row select shift register 604 includes eight (4+4) stages, so that all eight rows can be provided with different row select signals.

In an example, each EM bank includes one EM bank having EM memory units in eight rows and eight columns. In another example, each EM bank includes two matrices, each having EM memory units in eight rows and four columns. In a further example, each EM bank includes two matrices, each having EM memory units in four rows and eight columns. In accordance with all the three examples, both the column select shift register 602 and the row select shift register 604 include eight stages each.

The bank select shift register 606 can generate bank select signals at different points of time for different EM banks. The bank select signal can be provided to a bank select transistor in an EM bank. For example, the bank select signal for the EM bank 608-1 is provided to the bank select transistor 610. If each bank has more than one bank select transistor, the bank select signal can be provided to all the bank select transistors in that bank by connecting their respective gate terminals together. In an implementation, the bank select shift register 606 includes as many stages as the number of EM banks it is connected to. In other words, the bank select shift register 606 includes 'n' stages, for providing bank select signals to the n different EM banks.

As explained earlier, in order to access an EM memory unit in an EM bank for reading or writing, the row select transistor corresponding to the row of the EM memory unit and the column select transistor corresponding to the EM memory unit are to be turned on by supplying the row select signal and the column select signal to their respective gate terminals and the bank select transistor in that EM bank is to be turned on by providing the bank select signal at its gate terminal. For this, the column select shift register 602, the row select shift register 604, and the bank select shift register 606 can generate column select signal, row select signal, and bank select signal corresponding to the EM memory unit. Consider an example scenario in which the EM memory unit in the second row and third column in the second EM bank, i.e., 608-2 is to be accessed for writing data into it. In this scenario, the second stage of the row select shift register 604 provides the row select signal for the second row, the third stage of the column select shift register 602 provides the column select signal for the third column, and the second stage of the bank select shift register 606 generates the bank select signal for the second EM bank 608-2. In this manner, using the combination of the select shift registers, any EM memory unit in any row, column, and EM bank can be accessed.

As mentioned earlier, the bank select signal to different EM banks can be provided by different stages of the bank select shift register 606.

Figure 7:
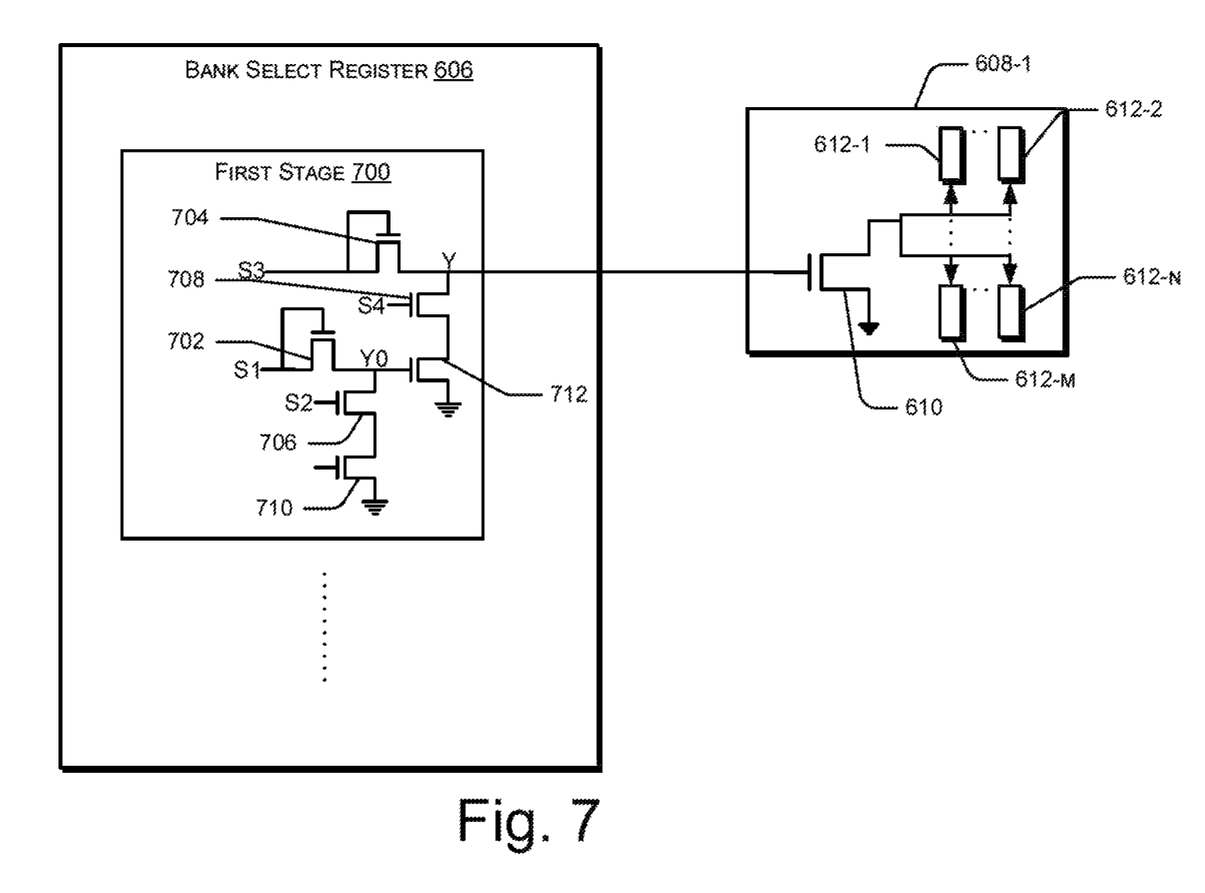
FIG. 7 illustrates first stage of a bank select shift register generating a bank select signal for an EM bank, according to an example implementation of the present subject matter.

FIG. 7 illustrates first stage 700 of the bank select shift register 606 providing the bank select signal to the EM bank 608-1, according to an example implementation of the present subject matter. It will be understood that the bank select shift register includes other stages for providing bank select signals to other EM banks.

As illustrated in FIG. 7, the first stage 700 of the bank select shift register 606 includes a plurality of transistors 702-712. The transistors can be, for example, N-channel field effect transistors (FET). As illustrated, the gate and drain terminals of transistor 702 receive a clock signal S1. The source terminal of the transistor 702 is coupled to a node Y0. The gate and drain terminals of transistor 704 receive a clock signal S3. The source terminal of the transistor 704 is coupled to a node Y, which, in turn, is connected to the gate terminal of the bank select transistor 710. The drain terminals of transistors 706 and 708 are coupled to the nodes Y0 and Y, respectively. The gate terminal of the transistor 706 receives a dock signal S2 and the gate terminal of the transistor 708 receives a dock signal S4. The source terminals of the transistors 706 and 708 are coupled to the drain terminals of transistors 710 and 712, respectively. The source terminals of the transistors 710 and 712 are coupled to a reference voltage, such as ground. The gate terminal of the transistor 710 may be coupled to the output of a decoder circuit (not shown in FIG. 7). The transistors corresponding to the transistor 710 in the subsequent stages of the bank select shift register 506 may be coupled to the output of their respective previous stages. For example, the transistor corresponding to the transistor 710 in the second stage may be coupled to the node Y.

The clock signals S1 through S4 are each a periodic sequence of pulses with sequential phase offset such that the pulse on S2 occurs after the pulse on S1, the pulse on S3 occurs after the pulse on S2, and so on.

In operation, during S1, the transistor 702 charges up (e.g., logic 1) the node Y0. At the same time, the decoder circuit provides a pulse and turns on the transistor 710. During S2, the decoder circuit continues to provide the pulse. Therefore, the node Y0 will be discharged and become logic 0, as both the transistors 706 and 710 are on. During S3, the decoder circuit ceases to provide the pulse and the node Y will be charged as the transistor 704. During 84, even though the transistor 708 is turned on, since Y0 is logic 0, the transistor 712 is off, and therefore, Y remains charged. Since the node Y is connected to the gate terminal of the bank select transistor 710, the bank select signal is provided to the bank select transistor 710 when the node Y is charged. It will be understood that when the above cycle repeats, the node Y remains charged, thereby continuously providing the bank select signal to the bank select transistor 710. In order to stop sending the bank select signal to the bank select transistor 710, for example, to select another EM bank, the decoder circuit can change the sequence in which it provides the pulses such that the node Y gets discharged.

Although implementations of the aspects of accessing memory units in a memory bank have been described in language specific to structural features and/or methods, it is to be understood that the present subject matter is not necessarily limited to the specific features or methods described. Rather, the specific features and methods are disclosed and explained as example implementations.

We claim:

1. A printhead component comprising:
a memory bank associated with a fluid ejection die of a printhead, the memory bank having a plurality of memory units arranged in the form of a matrix, the matrix having a plurality of rows and a plurality of columns; and
a bank select transistor common to the plurality of memory units, wherein the bank select transistor is to facilitate accessing a memory unit of the plurality of memory units based on a bank select signal.

2. The printhead component of claim 1, wherein each memory unit of the plurality of memory units is an electrically programmable read only memory (EM) memory unit.

3. The printhead component of claim 1, wherein the memory bank comprises a second plurality of memory units arranged in the form of a second matrix, wherein the system comprises a second bank select transistor common to the second plurality of memory units, and wherein the second bank select transistor is to receive the bank select signal to facilitate accessing a memory unit of the second plurality of memory units based on the bank select signal.

4. The printhead component of claim 1, wherein the memory unit of the plurality of memory units is accessible when a row select signal is received by a row having the memory unit and a column select signal is received by a column having the memory unit, and the bank select transistor receives the bank select signal.

5. The printhead component of claim 1, wherein the memory bank comprises information related to the fluid ejection die, the information comprising one of: identification information for the fluid ejection die, a serial number for the fluid ejection die, security information for the fluid ejection die, and feature enhancement information for the fluid ejection die.

6. The printhead component of claim 1, further comprising a row select transistor and a column select transistor to provide selection signals to the matrix of memory units along with the bank select transistor.

7. The printhead component of claim 6, wherein the bank select transistor is connected to each memory unit through the row select transistor and the column select transistor.

8. The printhead component of claim 1, wherein the memory bank comprises a plurality of memory units arranged into two separate matrices, and wherein the bank select transistor is connected in parallel to each of the two separate matrices of memory units.

9. The printhead component of claim 1, wherein the plurality of memory units are arranged into a plurality of different matrices, all the different matrices connected to a column select register, a row select register and a bank select register.

10. A printhead comprising
a fluid ejection die, the fluid ejection die having thereon:
a plurality of nozzles to eject drops of fluid;
a number of electrically programmable read only memory (EM) banks, wherein each EM bank comprises:
a plurality of EM memory units arranged in the form of a matrix, the matrix having a plurality of rows and columns; and
a bank select transistor common to the plurality of EM units, wherein the bank select transistor is to receive a bank select signal for facilitating access to an EM memory unit in the EM bank.

11. The printhead of claim 10, wherein:
each EM memory unit comprises a floating gate transistor capable of being accessed for being read from and written to,
each EM bank comprises:
a plurality of column select transistors, wherein each column select transistor corresponds to an EM memory unit of the plurality of EM memory units and is to receive a column select signal; and
a plurality of row select transistors, wherein each row select transistor corresponds to a row of the matrix and is to receive a row select signal, and
the floating gate transistor of each EM memory unit is connected to the column select transistor corresponding to the EM memory unit and the row select transistor corresponding to a row having the EM memory unit.

12. The printhead of claim 11, wherein the bank select transistor is connected to each row select transistor of the plurality of row select transistors.

13. The printhead of claim 11, comprising a row select register to provide row select signals to row select transistors of the plurality of EM banks and a column select register to provide column select signals to column select transistors of the plurality of EM banks.

14. The printhead of claim 10, wherein the bank select transistor is disposed around the plurality of EM memory units.

15. The printhead of claim 10, wherein each EM bank comprises:
a second plurality of EM memory units arranged in the form of a second matrix; and
a second bank select transistor common to each EM memory unit of the second plurality of EM memory units, and
wherein the second bank select transistor is to receive the bank select signal at its gate terminal.

16. The printhead of claim 10, comprising an identification (ID) line connected to each EM memory unit of the plurality of EM memory units for accessing the EM memory unit for at least one of reading and writing.

17. The printhead of claim 10, comprising a bank select register to provide bank select signals to bank select transistors of the plurality of EM banks.

18. A print cartridge comprising:
a print material reservoir to store a print material;
a print head coupled to the print material reservoir, the print head comprising a fluid ejection die having:
a plurality of nozzles to eject the print material;
a number of electrically programmable read only memory (EM) banks, wherein each EM bank of the plurality of EM banks comprises:
a first plurality of EM memory units arranged in the form of rows and columns; and
a first bank select transistor connected to each EM memory unit of the first plurality of EM memory units through a row select transistor and a column select transistor connected to the EM memory unit, wherein the first bank select transistor is to facilitate accessing the EM memory unit upon receiving a bank select signal.

19. The print cartridge of claim 18, comprising an identification (ID) line connected to each EM memory unit of the first plurality of EM memory units to access the EM memory unit.

20. The print cartridge of claim 18, wherein each EM bank comprises:
- a second plurality of EM memory units arranged in the form of rows and columns; and
- a second bank select transistor connected to each EM memory unit of the second plurality of EM memory units to facilitate accessing an EM memory unit of the second plurality of EM memory units when the second bank select transistor receives the bank select signal.

* * * * *